(12) United States Patent
Angerer et al.

(10) Patent No.: US 10,447,245 B1
(45) Date of Patent: Oct. 15, 2019

(54) ADAPTIVE SAMPLE RATE REDUCTION FOR DIGITAL IQ TRANSMITTERS

(71) Applicant: Intel Corporation, Santa Clara, CA (US)

(72) Inventors: Christoph Angerer, Sierning (AT); Alexander Klinkan, Linz (AT); Peter Plechinger, Linz (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,399

(22) Filed: Sep. 28, 2018

(51) Int. Cl.
| | |
|---|---|
| *H03H 17/06* | (2006.01) |
| *H04B 1/04* | (2006.01) |
| *H04L 27/26* | (2006.01) |
| *H04W 72/04* | (2009.01) |
| *G06F 9/30* | (2018.01) |

(52) U.S. Cl.
CPC ..... *H03H 17/0657* (2013.01); *G06F 9/30116* (2013.01); *H03H 17/0671* (2013.01); *H04B 1/0475* (2013.01); *H04L 27/2605* (2013.01); *H04W 72/0446* (2013.01); *H04W 72/0453* (2013.01); *H04B 2001/0491* (2013.01)

(58) Field of Classification Search
CPC .......... H03H 17/0657; H03H 17/0671; H04B 1/0475; H04B 2001/0491; G06F 9/30116; H04L 27/2605; H04W 72/0446; H04W 72/0453
See application file for complete search history.

(56) References Cited

U.S. PATENT DOCUMENTS

| | | | |
|---|---|---|---|
| 6,862,325 B2 | 3/2005 | Gay-Bellile et al. | |
| 9,912,357 B1 | 3/2018 | Parker et al. | |
| 2004/0152418 A1* | 8/2004 | Sinha | H04L 27/0002 455/42 |
| 2005/0243952 A1 | 11/2005 | Li | |
| 2014/0361913 A1* | 12/2014 | Hsieh | H03M 3/496 341/143 |

* cited by examiner

*Primary Examiner* — Vineeta S Panwalkar
(74) *Attorney, Agent, or Firm* — Eschweiler & Potashnik, LLC

(57) ABSTRACT

A communication system using adaptive sample rate reduction (ASRR) is disclosed. The system includes a digital front end (DFE) and a radio frequency (RF) interface. The DFE is configured to receive a baseband signal, identify reduced performance parameters for the baseband signal, reduce a sampling rate for the baseband signal based on the reduced performance parameters and generate a digital interface signal using the reduced sampling rate. The RF interface is configured to generate an analog TX signal from the digital interface signal.

22 Claims, 14 Drawing Sheets

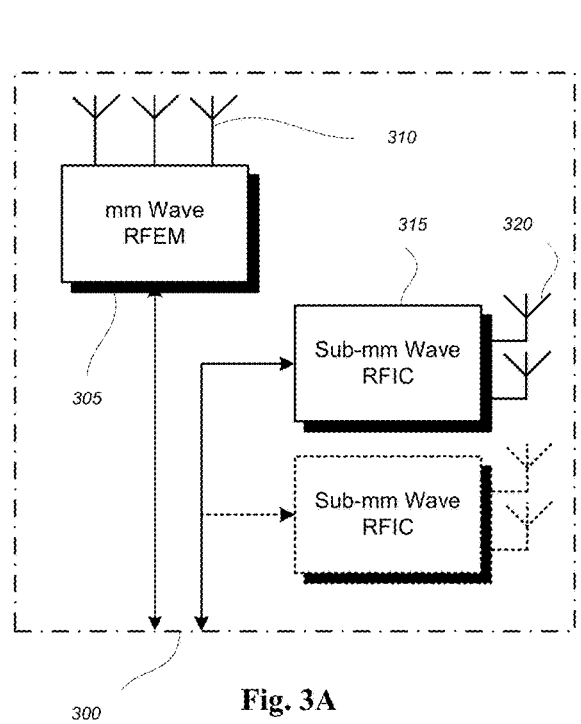
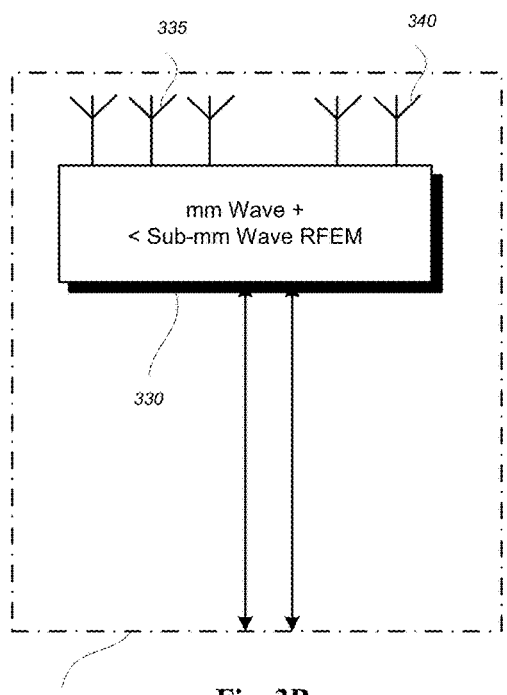
Fig. 3A
Fig. 3B

| STD/RATE | SAMPLING | OUTPUT MC DFE | RATE | INTERP RATE | CIC STAGES | RF PROC RATE |
|---|---|---|---|---|---|---|
| 3G UMTS | 3.84MHz | 38.4MHz | 38.4MHz | 40MHz | 6 CIC stages (x256) | 2593MHz |
| LTE1.4 | 1.92MHz | 4.8MHz | 9.6MHz | 10MHz | 6 CIC stages (x256) | 2593MHz |
| LTE3 | 3.84MHz | 9.6MHz | 19.2MHz | 20MHz | 7 CIC stages (x128) | 2593MHz |
| LTE5/NR5 | 7.68MHz | 19.2MHz | 38.4MHz | 40MHz | 6 CIC stages (x64) | 2593MHz |
| LTE10/NR10 | 15.36MHz | 38.4MHz | 76.8MHz | 81Mhz | 5 CIC stages (x32) | 2593MHz |
| LTE15/NR15 | 30.72MHz | 76.8MHz | 153.6MHz | 162MHz | 4 CIC stages (x16) | 2593MHz |
| LTE20/NR20 | 30.72MHz | 76.8MHz | 153.6MHz | 162MHz | 4 CIC stages (x16) | 2593MHz |
| NR25 | 30.72MHz | 76.8MHz | 153.6MHz | 162MHz | 4 CIC stages (x16) | 2593MHz |
| NR30 | 61.44MHz | 153.6MHz | 307.2MHz | 324MHz | 3 CIC stages (x8) | 2593MHz |
| NR40 | 61.44MHz | 153.6MHz | 307.2MHz | 324MHz | 3 CIC stages (x8) | 2593MHz |
| NR50 | 61.44MHz | 153.6MHz | 307.2MHz | 324MHz | 3 CIC stages (x8) | 2593MHz |
| NR60 | 122.88MHz | 307.2MHz | 614.4MHz | 648MHz | 2 CIC stages (x4) | 2593MHz |
| NR80 | 122.88MHz | 307.2MHz | 614.4MHz | 648MHz | 2 CIC stages (x4) | 2593MHz |
| NR100 | 122.88MHz | 307.2MHz | 614.4MHz | 648MHz | 2 CIC stages (x4) | 2593MHz |
| 2xLTE20 | 2x30.72MHz | 2x153.6MHz | 307.2MHz | 324MHz | 3 CIC stages (x8) | 1593MHz |
| 3xLTE20 | 3x30.72MHz | 3x307.2MHz | 614.4MHz | 648MHz | 2 CIC stages (x4) | 2593MHz |
| 4xLTE20 | 4x30.72MHz | 4x307.2MHz | 614.4MHz | 648MHz | 2 CIC stages (x4) | 2593MHz |
| 5xLTE20 | 5x30.72MHz | 5x307.2MHz | 614.4MHz | 648MHz | 2 CIC stages (x4) | 2593MHz |
| 2xNR100 | 2x122.88MHz | 2x307.2MHz | 614.4MHz | 640MHz | 2 CIC stages (x4) | 2593MHz |

700

Example: $f_{REF}$ = 2593MHz (Band41)

ADAPTIVE SAMPLE RATE REDUCTION FOR DIGITAL IQ TRANSMITTERS

FIELD

Various embodiments generally relate to the field of wireless communications.

BACKGROUND

Wireless communication systems provide communication between devices.

The communication utilizes large number of resources including bandwidth, physical resources, complexity, power and the like. There are limited resources available for ever growing communication demands.

What are needed are techniques to facilitate use resources, such as power consumption for wireless communication.

BRIEF DESCRIPTION OF THE DRAWINGS

FIG. 3A and FIG. 3B illustrate aspects of an exemplary radio front end module.

FIG. 7 is a diagram illustrating example signals and sampling rates that can be obtained in accordance with some embodiments.

DETAILED DESCRIPTION

Figure 1:
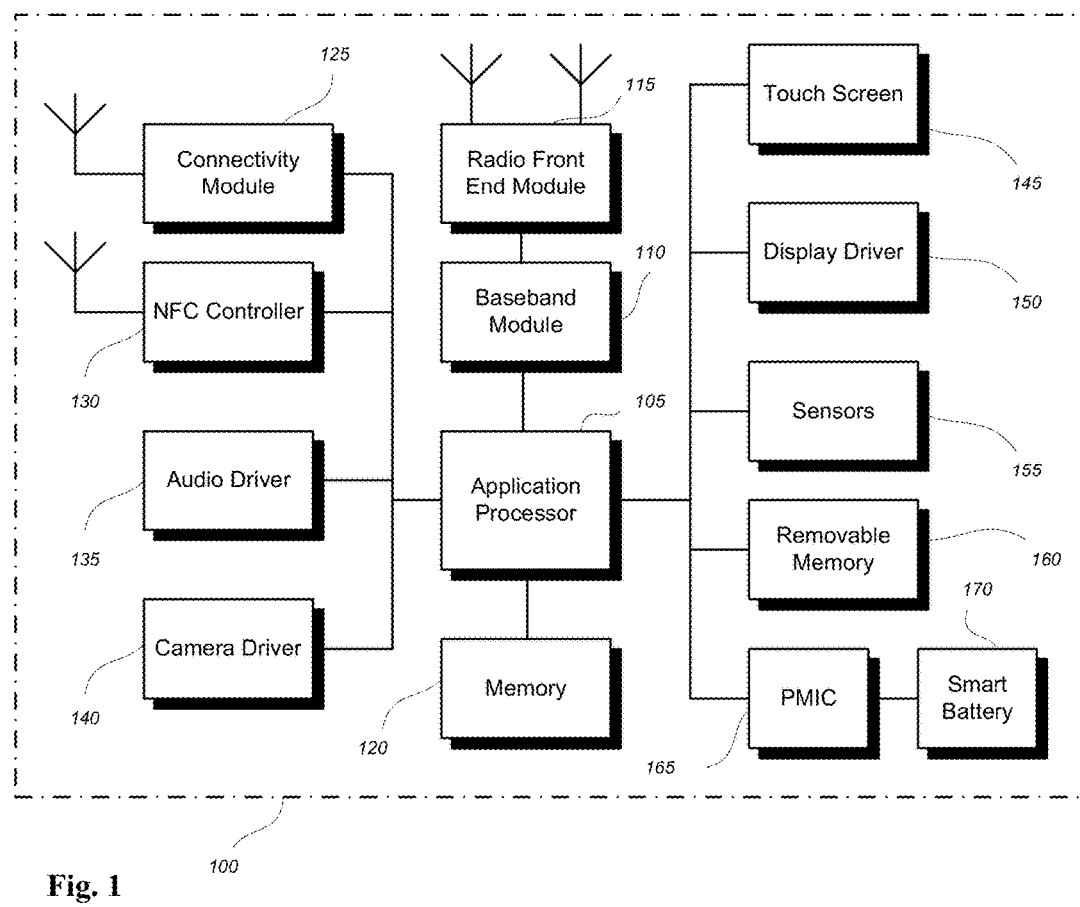
FIG. 1 illustrates an exemplary user device in accordance with an aspect.

The present disclosure will now be described with reference to the attached drawing figures, wherein like reference numerals are used to refer to like elements throughout, and wherein the illustrated structures and devices are not necessarily drawn to scale. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. Embodiments herein may be related to RAN1, RAN2, 5G and the like.

As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

It is appreciated that Base stations configure UEs to a certain transmission bandwidth, independent of the assigned resource blocks (RBs). Likewise, the sample rates in the Digital Front End (DFE) of an all-digital in-phase quadrature (IQ) radio frequency (RF) transmitter depends on the configured transmission bandwidth, whereas the effective bandwidth defined by the number and spectral location of RBs is not taken into account. Thus, the power consumption is independent of the actually assigned resource blocks.

Adaptive Sample Rate Reduction (ASRR) is an approach to remedy this drawback. It enables a reduction of power consumption by reducing the sample rate in the digital IQ RF transmitters when there are only a small number of configured resource blocks used. The approach focuses on high-power consuming blocks running on the higher sample rates in the DFE (towards the RFDAC). Additionally, the approach can be activated for lower transmit (TX) output power, when performance of filters and upsamplers is less crucial. Thus, it enables lower power consumption for lower transmission bandwidth or transmit power.

Another approach, referred to as IQ Breathing is applied in the Single Carrier DFE (SC-DFE), i.e. applied before the channel weighter in the TX DFE, where single carriers in a carrier-aggregation scenario are preprocessed individually. In cases of any (non-carrier-aggregation) RAT configuring less than 6 resource blocks, the chains are reconfigured to LTE1.4 transmission, thus running on the lowest possible rate. This approach is restricted to single carrier chains: When the sample rate is changed, the filters in the DFE show a transition phase. This transition is mitigated, by configuring a second single-carrier chain with the adapted sample rate. At the timestamp of sample rate switching, the transition phase of the new chain is already completed, and the output of the two chains can be seamlessly switched. Thus, the feature requires two hardware (HW) lineups that are running simultaneously with distinct configurations during transition phase.

However, IQ Breathing requires two HW lineups for seamless switching of the sample rate. These DFE lineups are available in the multi-carrier DFE (MC-DFE), where the individual carriers are preprocessed before being weighted and added to a single TX stream in the channel weighter. During the transition from one sample rate to another, two DFE chains are required to be activated, resulting in a power penalty during the transition times. Carrier aggregation scenarios are not supported, since all single-carrier DFE lineups are in use in this scenario, and no HW is available for IQ breathing. In order to enable IQ breathing in CA cases as well as for blocks outside the single carrier DFE, additional DFE chains would be required, resulting in an area penalty. Therefore, IQ breathing is basically restricted to the single carrier DFEs, which is running on low sample rates, and therefore the contribution to power consumption is lower than for blocks closer to the RFDAC.

Intel's polar mobile communication transmitters offer the feature of Polyphase Switching: the sample rate in the transmitter is increased/decreased by a static configuration of the number of active polyphases in the DFE.

Polyphase switching is a sample rate reduction technique employed in Intel's polar TX. In this concept, the sample rate is statically pre-adjusted, according to the current configuration consisting of—RAT, bandwidth and TX-output power. In contrast to the presented approach in this ID, the actual RB allocation is not considered.

In comparison to the polar TX architecture, the digital IQ modulator experiences the following advantages with respect to dynamic sample rate adaption:

In digital IQ, allocation of a fraction x % of the available spectrum allows for a reduction of x % of sample rate. In polar transmitters sample rate switching points need to be simulated and stored in tables, which makes control more elaborated.

Digital IQ TXs have identical I and Q paths, while the signal processing in polar transmitters is distinct for phase and amplitude. Consequently a sample rate change in digital IQ TXs results in a delay change, which is different for the phase and amplitude path in polar TXs, thus a re-alignment of the delay of the phase and amplitude paths is required.

Embodiments and/or aspects are disclosed that reduce sampling rates for a digital front end (DFE) of a transmitter/receiver. In particular, scenarios with lower TX bandwidth and/or reduced TX output power are identified and a reduced sampling rate is determined. The reduced sampling rate can be used resulting in reducing power consumption without degrading communication. Additionally, the sampling rate can be adjusted dynamically to mitigate the power consumption of the DFE.

FIG. 1 illustrates a user device 100 in accordance with an aspect. The user device 100 may be a mobile device or a wearable device in some aspects and includes an application processor 105, baseband processor 110 (also referred to as a baseband module), radio front end module (RFEM) 115, memory 120, connectivity module 125, near field communication (NFC) controller 130, audio driver 135, camera driver 140, touch screen 145, display driver 150, sensors 155, removable memory 160, power management integrated circuit (PMIC) 165 and smart battery 170. The user device 100 can include and/or be incorporated with human proximity sensing circuitry.

In some aspects, application processor 105 may include, for example, one or more CPU cores and one or more of cache memory, low drop-out voltage regulators (LDOs), interrupt controllers, serial interfaces such as serial peripheral interface (SPI), inter-integrated circuit ($I^2C$) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 110 may be implemented, for example, as a solder-down substrate including one or more integrated circuits, a single packaged integrated circuit soldered to a main circuit board, and/or a multi-chip module containing two or more integrated circuits.

Figure 2:
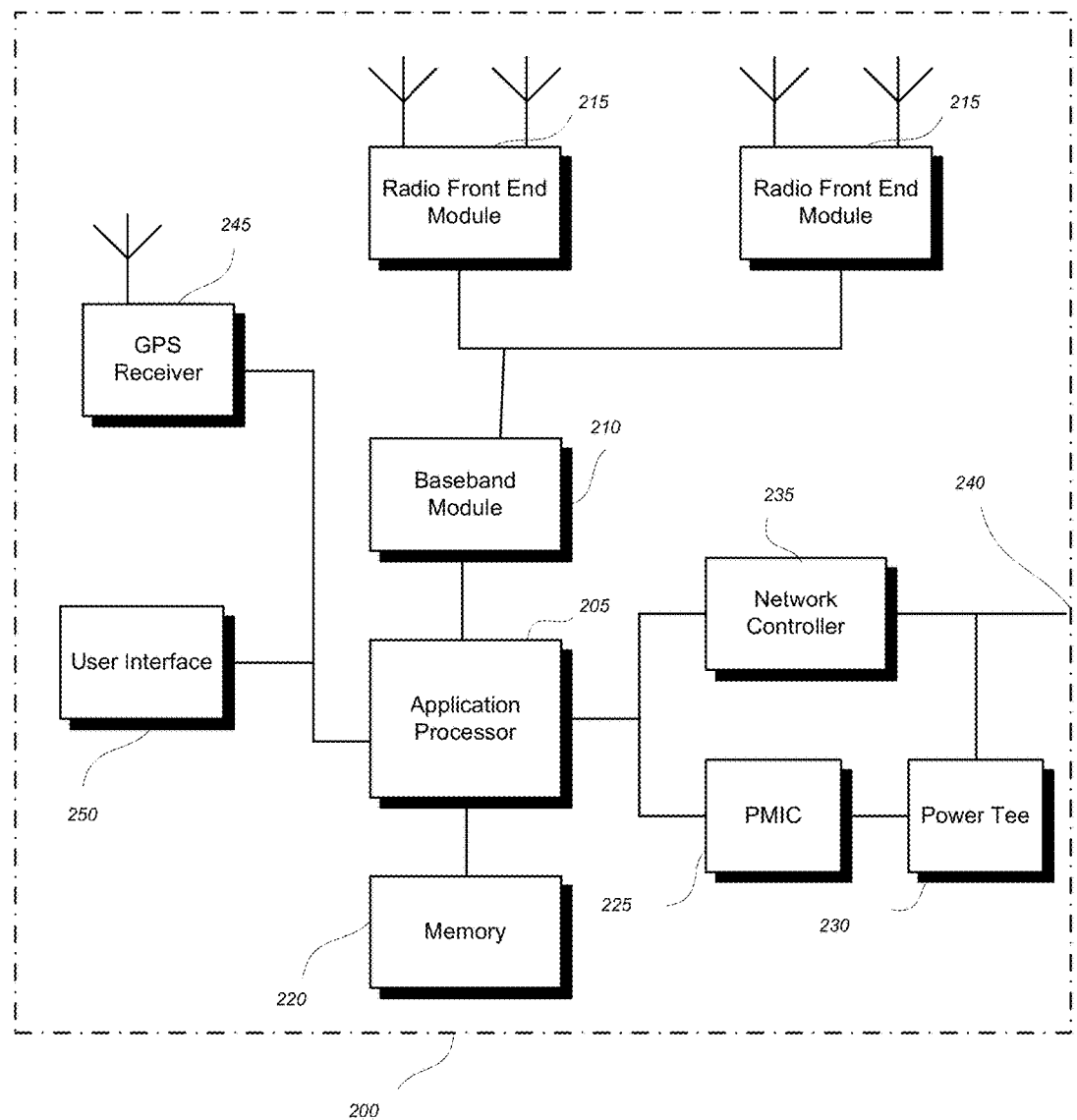
FIG. 2 illustrates an exemplary base station or infrastructure equipment radio head in accordance with an aspect.

FIG. 2 illustrates a base station or infrastructure equipment radio head 200 in accordance with an aspect. The base station radio head 200 may include one or more of application processor 205, baseband modules 210, one or more radio front end modules 215, memory 220, power management circuitry 225, power tee circuitry 230, network controller 235, network interface connector 240, satellite navigation receiver module 245, and user interface 250.

In some aspects, application processor 205 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose 10, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip module containing two or more integrated circuits.

In some aspects, memory 220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable to provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide data to application processor 205 which may include one or more of position data or time data. Application processor 205 may use time data to synchronize operations with other radio base stations.

In some aspects, user interface 250 may include one or more of physical or virtual buttons, such as a reset button, one or more indicators such as light emitting diodes (LEDs) and a display screen.

It is appreciated that the radio head 200 can also include a single RF front end module, including a single RF front end module for MIMO.

FIG. 3A and FIG. 3B illustrate aspects of a radio front end module.

FIG. 3A illustrates an aspect of a radio front end module 300 incorporating a millimeter wave radio front end module (RFEM) 305 and one or more sub-millimeter wave radio frequency integrated circuits (RFIC) 315. In this aspect, the one or more sub-millimeter wave RFICs 315 may be physically separated from a millimeter wave RFEM 305. RFICs 315 may include connection to one or more antennas 320. RFEM 305 may be connected to multiple antennas 310.

FIG. 3B illustrates an alternate aspect of a radio front end module 325. In this aspect, both millimeter wave and sub-millimeter wave radio functions may be implemented in the same physical radio front end module 330. RFEM 330 may incorporate both millimeter wave antennas 335 and sub-millimeter wave antennas 340.

Figure 4A:
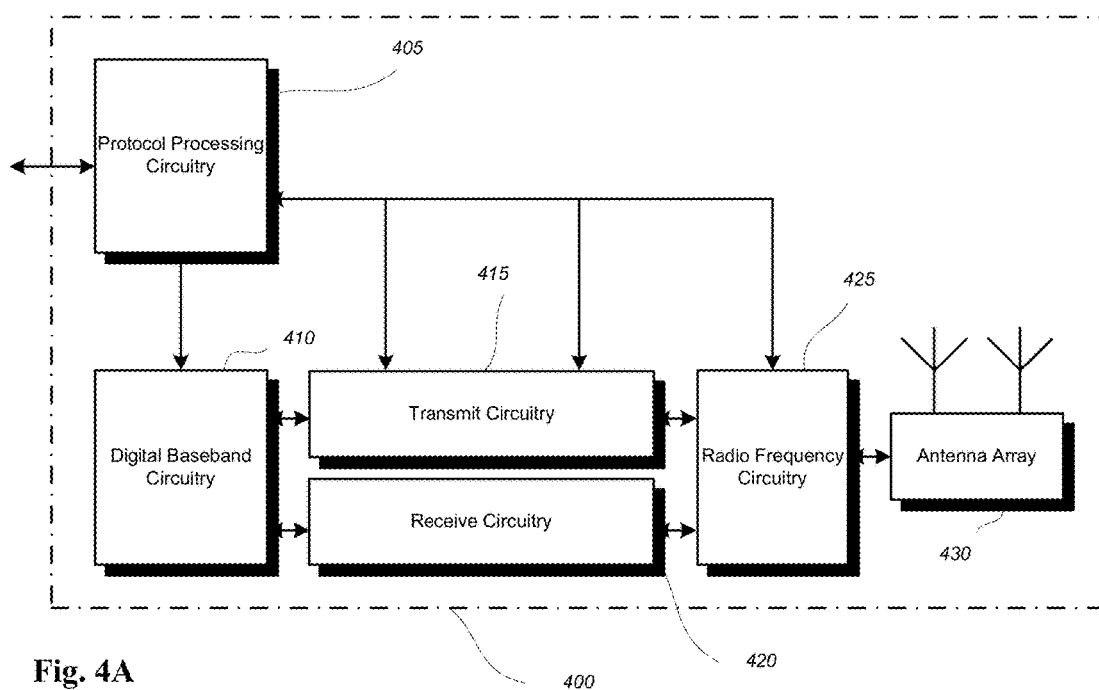
FIG. 4A illustrates an exemplary millimeter wave communication circuitry 400 according to some aspects.

FIG. 4A illustrates an exemplary millimeter wave communication circuitry 400 according to some aspects. Circuitry 400 is alternatively grouped according to functions. Components as shown in 400 are shown here for illustrative purposes and may include other components not shown here in FIG. 4A.

Millimeter wave communication circuitry 400 may include protocol processing circuitry 405, which may implement one or more of medium access control (MAC), radio link control (RLC), packet data convergence protocol (PDCP), radio resource control (RRC) and non-access stratum (NAS) functions. Protocol processing circuitry 405 may include one or more processing cores (not shown) to execute instructions and one or more memory structures (not shown) to store program and data information.

Millimeter wave communication circuitry 400 may further include digital baseband circuitry 410, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 400 may further include transmit circuitry 415, receive circuitry 420 and/or antenna array circuitry 430.

Millimeter wave communication circuitry 400 may further include radio frequency (RF) circuitry 425. In an aspect of the invention, RF circuitry 425 may include multiple parallel RF chains for one or more of transmit or receive functions, each connected to one or more antennas of the antenna array 430.

In an aspect of the disclosure, protocol processing circuitry 405 may include one or more instances of control circuitry (not shown) to provide control functions for one or more of digital baseband circuitry 410, transmit circuitry 415, receive circuitry 420, and/or radio frequency circuitry 425.

Figure 4B:
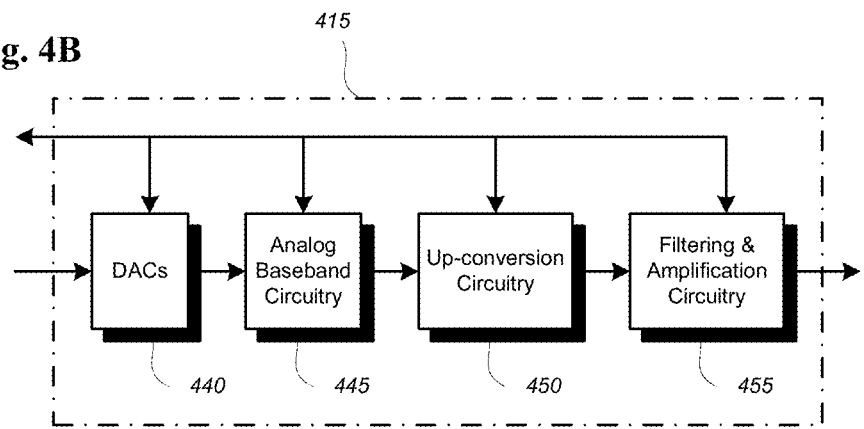
FIGS. 4B and 4C illustrate examples for transmit circuitry in FIG. 4A in some aspects.
Figure 4C:
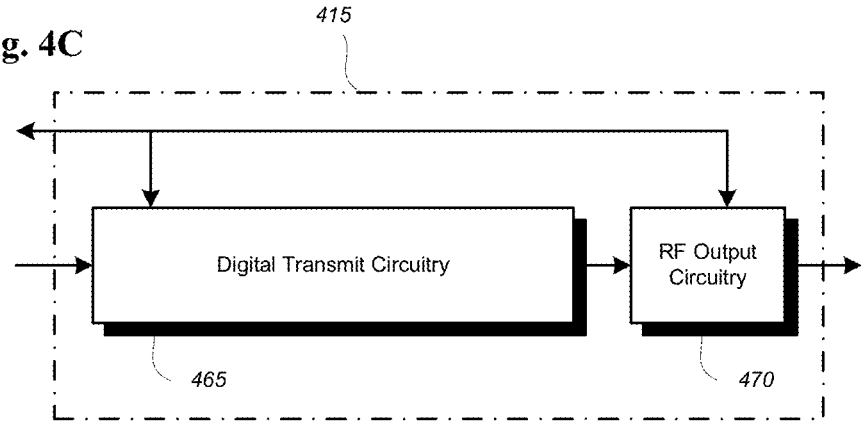

FIGS. 4B and 4C illustrate examples for transmit circuitry 415 in FIG. 4A in some aspects.

The exemplary transmit circuitry 415 of FIG. 4B may include one or more of digital to analog converters (DACs) 440, analog baseband circuitry 445, up-conversion circuitry 450 and filtering and amplification circuitry 455. In another aspect, 4C illustrates an exemplary transmit circuitry 415 which includes digital transmit circuitry 465 and output circuitry 470.

Figure 4D:
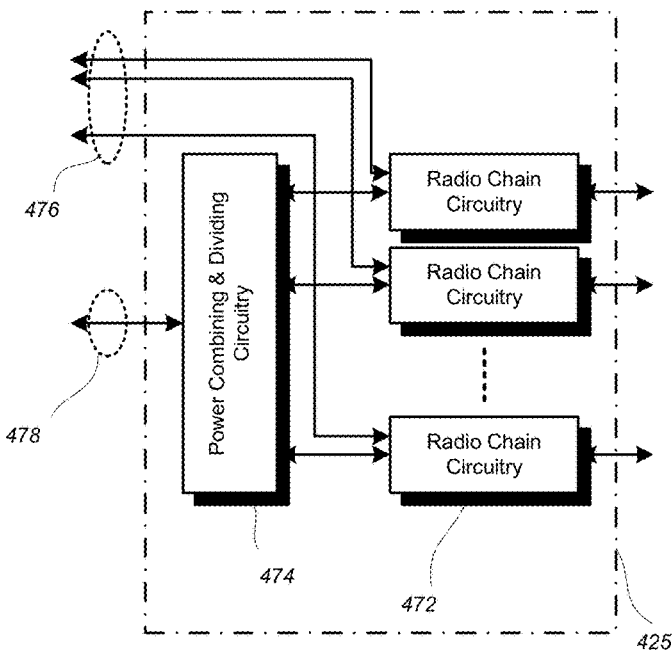
FIG. 4D illustrates an exemplary radio frequency circuitry in FIG. 4A according to some aspects.

FIG. 4D illustrates an exemplary radio frequency circuitry 425 in FIG. 4A according to some aspects.

Radio frequency circuitry 425 may include one or more instances of radio chain circuitry 472, which in some aspects may include one or more filters, power amplifiers, low noise amplifiers, programmable phase shifters and power supplies (not shown).

Radio frequency circuitry 425 may include power combining and dividing circuitry 474 in some aspects. In some aspects, power combining and dividing circuitry 474 may operate bidirectionally, such that the same physical circuitry may be configured to operate as a power divider when the device is transmitting, and as a power combiner when the device is receiving. In some aspects, power combining and dividing circuitry 474 may one or more include wholly or partially separate circuitries to perform power dividing when the device is transmitting and power combining when the device is receiving. In some aspects, power combining and dividing circuitry 474 may include passive circuitry comprising one or more two-way power divider/combiners arranged in a tree. In some aspects, power combining and dividing circuitry 474 may include active circuitry comprising amplifier circuits.

In some aspects, radio frequency circuitry 425 may connect to transmit circuitry 415 and receive circuitry 420 in FIG. 4A via one or more radio chain interfaces 476 or a combined radio chain interface 478.

In some aspects, one or more radio chain interfaces 476 may provide one or more interfaces to one or more receive or transmit signals, each associated with a single antenna structure which may comprise one or more antennas.

In some aspects, the combined radio chain interface 478 may provide a single interface to one or more receive or transmit signals, each associated with a group of antenna structures comprising one or more antennas.

Figure 4E:
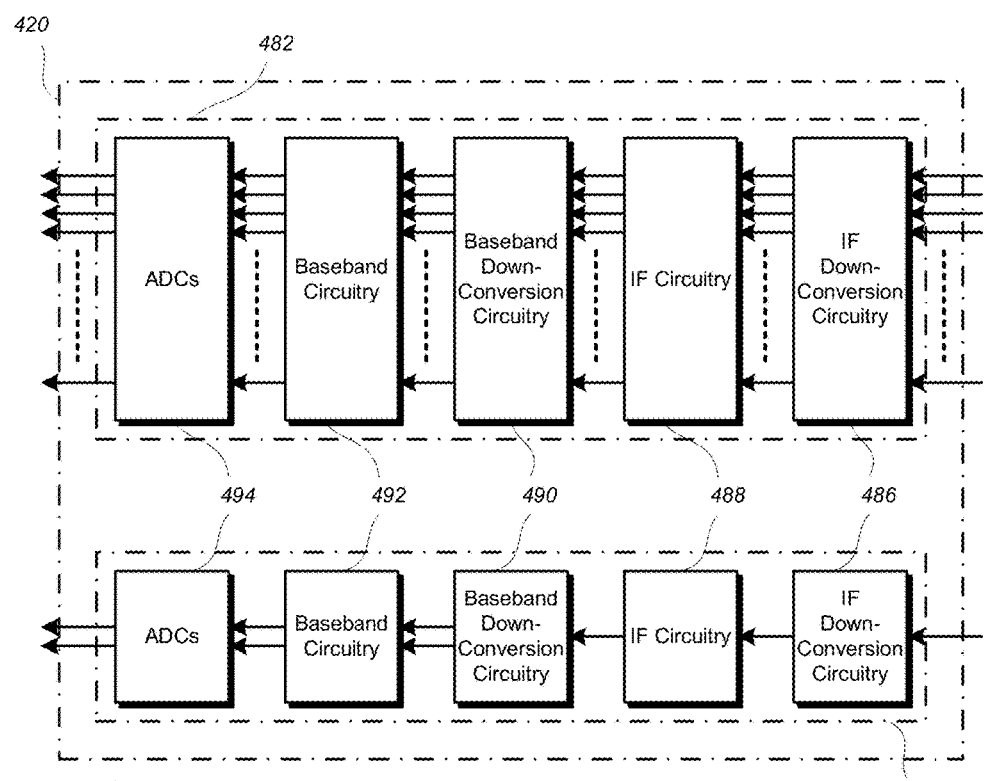
FIG. 4E illustrates exemplary receive circuitry in FIG. 4A according to some aspects.

FIG. 4E illustrates exemplary receive circuitry 420 in FIG. 4A according to some aspects. Receive circuitry 420 may include one or more of parallel receive circuitry 482 and/or one or more of combined receive circuitry 484.

In some aspects, the one or more parallel receive circuitry 482 and one or more combined receive circuitry 484 may include one or more Intermediate Frequency (IF) down-conversion circuitry 486, IF processing circuitry 488, baseband down-conversion circuitry 490, baseband processing circuitry 492 and analog-to-digital converter (ADC) circuitry 494.

Figure 5:
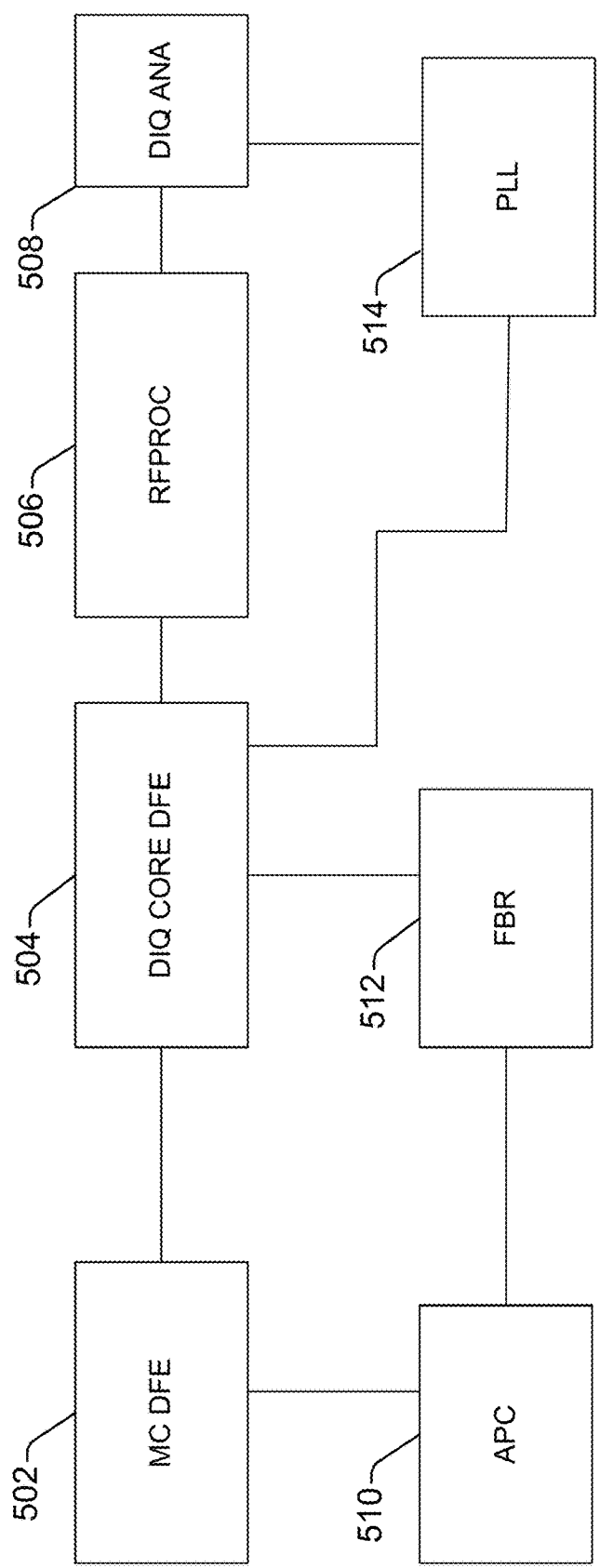
FIG. 5 is a diagram illustrating an arrangement for a transmit/transmitter (TX) system in accordance with some embodiments and/or aspects.

FIG. 5 is a diagram illustrating an arrangement for a transmit/transmitter (TX) system 500 in accordance with some embodiments and/or aspects. The system 500 can dynamically adjust sampling rate to reduce power consumption and the like without substantially degrading communication.

The system 500 can be implemented in front end circuitry, such as the radio front end module 115, the radio front end module 215, the radio front end module 300, the radio front end module 325 and variations thereof. The system 500 can be used with user device 100, a base station or infrastructure equipment radio head 200 and the like.

FIG. 5 is provided at a high level to facilitate understanding. It is appreciated that other circuits and the like can be included. Additional details and examples are provided in subsequent figures.

The TX system 500 includes a multiple-carrier (MC) DFE 502, a digital IQ (DIQ) core DFE 504 and digital IQ RF processing 506. The system 500 can use and/or include other elements such as, a DIQ analog circuit 508, an APC 510, a FBR 512 and a phase locked loop (PLL) 514.

The system 500 can be used as, within, and/or in conjunction with the radio front end module 115, the radio front end module(s) 215, and the like. Further, the system can be used as, within and/or in conjunction with the transmit circuitry 415.

Further, the system 500 can be used within a user equipment (UE) device and/or in conjunction with a base station.

The MC DFE 502 includes a plurality or multiple single carrier DFEs (SCDFEs). Each single carrier DFE preprocesses one carrier and the preprocessed outputs from the multiple SCDFEs are aggregated and provided as an output.

The core DFE 504 includes multiple signal processing blocks, which generally use a pre-determined or certain oversampling for proper operation. The processing blocks can include peak-to-average-power-ratio-reduction (PA-PRR), power amplifier pre-distortion, RFDAC pre-distortion and the like. In one example, the sample rate in the core DFE 504 is about 5 times a baseband interface rate, such as the rate from baseband module 110, 210. A last block in the core DFE 504, in one example, is a Lagrange interpolator, which alters a sampling rate of the core DFE 506 to an interpolator output sample rate, which is $f_{LO}/2^M$, where $f_{LO}$ is a local oscillator or carrier frequency, such as 600 MHz to 6 GHz and M is an integer, such as 3 to 6 or 7.

The core DFE 504 is configured to perform adaptive sampling rate reduction (ASRR). The ASRR is performed by identifying rate reduction criteria or reduced performance requirements, such as reduced/lower TX power, reduced/lower bandwidth, resource block allocation and/or the like for communications. The reduced performance parameters, in one example are values that are less than preconfigured or assigned performance parameters for transmission. The reduced performance parameters, in another example, are less than prior performance values from a previous period, such as symbol, slot, frame, burst and the like. The reduced performance parameters, in another example, are less than performance values configured for a transmission. The preconfigured or assigned values can be provided, for example, by a base station. It is appreciated that the reduced performance parameters can also be greater than prior performance parameters and/or referred to as adjusted performance parameters.

In one example, a user equipment (UE) device having the system 500 can be assigned/configured a transmission bandwidth by a base station, but the actual used bandwidth may be less than the assigned/configured transmission bandwidth. If the actual/used bandwidth is less than the configured or assigned, this is identified as a reduced performance parameter.

Once the rate reduction criteria or reduced performance parameter has be met or identified, the ASRR dynamically adjusts or reduces a sampling rate based on the reduced/adjusted performance parameters.

The DFE 504 is also configured to generate configuration values or settings used to implement the reduced/adjusted sampling rate. The configuration values can be applied to DFE elements, such as upconverters, downconverters, interpolators and the like.

The DFE 504 can also be configured to generate a delay or group delay based on or in response to the reduced sampling rate. The group delay is calculated or determined based on structure of the DFE 504, such as filters and corresponding filter length. The group delay is then applied to the structure of the DFE 504 to mitigate an error vector magnitude (EVN) and the like due to the reduced sampling rate. It is appreciated that the reduced sampling rate can cause delays and the like, which can result in noise, such as increasing an error vector magnitude (EVM). In one example, a ring buffer is used to store and apply the group delay.

The digital IQ RF processing circuitry 506 conditions an input signal to meet RFDAC interference requirements or parameters. In one example, the input signal is upsampled by a sequence of M cascaded integrator-comb (CIC) filters (upsampling ratio is $2^M$) and modified in amplitude to fit the RFDAC requirements. The RF processing circuitry typically runs at a clock frequency derived from a local oscillator (LO) signal.

The RF processing circuitry 506 is synchronized with the DFE 504 to account for the adjusted/reduced sampling rate. To maintain synchronization, the DFE 504 can synchronize at least a portion of the RF processing circuitry 506 with the reduced sampling rate.

Figure 6:
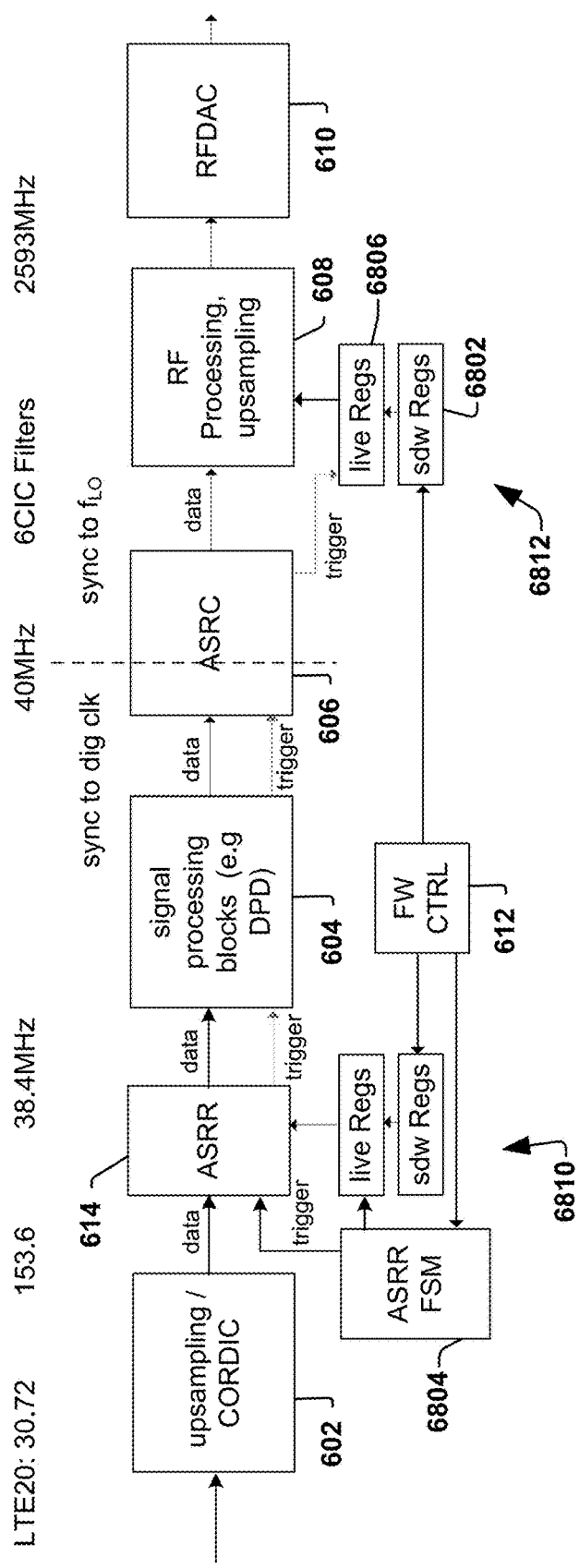
FIG. 6 is a diagram illustrating an arrangement for a transmitter/transmitter system in accordance with some embodiments.

FIG. 6 is a diagram illustrating an arrangement for a transmit/transmitter (TX) system 600 in accordance with some embodiments and/or aspects. The system 600 can dynamically adjust sampling rate to reduce power consumption and the like without substantially degrading communication.

The system 600 can be used as and/or with the system 500.

The system 600 can be implement in front end circuitry, such as the radio front end module 115, the radio front end module 215, the radio front end module 300, the radio front end module 325 and variations thereof. The system 600 can be used with user device 100, a base station or infrastructure equipment radio head 200 and the like.

The system 600 receives an input signal, such as a baseband signal or signal from a fast Fourier transform (FFT) signal and generates an output signal for transmission.

The system 600 includes an upsampling/CORDIC circuit 602, signal processing blocks/circuits 604, an ASRC 606, an RF processing block/circuit 608, an RF DAC 610 and a firmware control circuit 612.

An input interface for the upsampling/CORD IC 602 can have an interface rate defined by a standard. For example, for LTE20, the fast Fourier transform (FFT) size for OFDM signal generation is 2048, the subcarrier spacing 15 kHz, yielding 30.72 mega samples per second (MS/s) (as an example). The CORDIC 602 can be part of the MC DFE 502.

Generally, signal processing blocks/circuits use or require an amount of upsampling. For example, to apply a predistortion of Kth order, an oversampling of a factor of K is required. This upsampling is achieved in the upsampling block 602.

Additionally, the radio frequency (RF) digital to analog converter (DAC) (RFDAC) 610 typically requires or uses data applied synchronously to a carrier frequency $f_{LO}$. Thus the arbitrary Sample Rate Converter (ASRC) 606 is used and configured to synchronize data or signals from the signal processing blocks 604. The ASRC 606 can be incorporated in the DIQ core DFE 504. The signal processing blocks 604 can also be incorporated in the DIQ core DFE 504.

For operation without ASRR, 4 CIC filters are applied to achieve the target $f_{LO}$ of 2593 MHz (exemplarily $f_{LO}$ is band dependent).

Where the bandwidth or resources are reduced, such as to a fraction of an allocated bandwidth, the FFT size is still the same. This is true even with sample rate reduction, such as ASRR, by 4.

Resource blocks (RBs) are centered in frequency by the upsampling/CORDIC block/circuit 602.

ASRR is applied at the ASRR circuit 614 to reduce the sample rate after the upsampling. The reduced sampling rate can also be implemented by performing less upsampling at the upsampling circuit 602. The ASRR circuit 614 can be incorporated into the DIQ core DFE 504.

It is appreciated that some processing blocks/circuits can be present, such as Envelope Tracking (ET), typically require the full upsampling. However, in general, the upsampling can be reduced instead of applying upsampling and later downsampling).

The blocks after ASRR 614, such as the blocks/circuits 604, are can operate or run on a lower rate, thus saving power. These blocks/circuits 604 can include, DPD, ASRC, PAPRR and the like. These blocks/circuits 604 can also be incorporated into the DIQ core DFE 504.

The RF processing block/circuit 608 includes upsampling circuitry to increase the rate. If the sample rate has been reduced at the ASRR, additional upsampling is needed at the RF processing 608 and performed by the upsampling circuitry. The RF processing 608 can be incorporated into the RF PROC 506.

In one example, the upsampling circuitry of the block 608 is performed by a sequence of M cascaded integrator-comb (CIC) filters (upsampling ratio is $2^M$).

For example, to obtain the same sampling rate as without ASRR, additional upsampling is applied in the RF processing (6 CIC filters with ASRR, rate reduction by 4 instead of 4 CIC filters in the case without ASRR).

It is appreciated that the system 600 can change the sample rate at the ASRR block 614 dynamically. The sample rate can change for relatively short durations, such as by symbol, slot, frame, burst and the like.

Synchronization is performed to compensate and/or account for these durations. The synchronization includes synchronization between the ASRR circuit 614 and the RF processing block 608. Thus, as an example, downsampling in the ASRR block 614 is properly synchronised with the upsampling in the RF Processing block 608.

This synchronization is performed by shadow/live circuitry 6810 and 6812. The shadow/live circuitry 6810 and 6812 includes a finite state machine (FSM) 6804 and shadow registers 6802 and live registers 6806.

A firmware (FW) control circuit 612 pre-configures settings for the adapted sampling rate. The settings are activated in the ASRR block 614, when a trigger is generated from the FSM 6804. The trigger travels with the data through the subsequent blocks (shown as lower line) and reaches the RF processing 608 with the first sample at the adapted or reduced rate. Then, the trigger activates the configuration data there (by moving it from the shadow register 6802 to the live register 6806).

The time at which the sample rate is adjusted or reduced is also controlled by the FW circuit 612 and configured in the FSM 6804, in one example.

The ASRR FSM 804, in this example, is a counter that is reset at the start of a transmission, which is compared to a configured value (from FW). If the configured value is reached, a trigger is generated. The FW 612 configures the ASRR FSM 804 such, that it generates a trigger at the proper time instant, i.e. at the symbol boundary when the RB allocation (or TX power) is changed. The configured value can represent a reduced performance parameter, such as a reduced number of resource blocks.

The FW control 612 and the FSM 6804 are an example of a suitable control circuit to control and perform ASRR and synchronization. However, it is appreciated that other suitable control circuit designs are contemplated to perform ASRR and synchronization.

The control circuit can also determine a group delay for the signal processing blocks 604 and apply the group delay to the blocks. The group delay can be based on filters and the like within the processing blocks 604. In one example, the control circuit calculates a group delay based on the reduced/adjusted sample rate and the processing blocks 604 (and/or filters of the processing blocks 604). In another example, group delay values are pre-determined according to sample rate and a look up table is used to provide the group delay based on the adjusted sample rate. The group delay can mitigate EVM.

Further, the control circuit can at least partially be located within the DFE or in other circuitry.

The control circuit can be implemented using one or more processors that execute software or firmware to perform and/or control the ASRR and the synchronization.

The system 600 is not restricted to cellular communication (i.e. LTE or NR), but can be applied to other communications using OFDM like transmitter with changing RB size.

The RF digital to analog converter (DAC) converts a digital signal from the RF processing block 608 to an analog output signal, that can be used for transmission. The clock rate is derived from and synchronous to the RF. An interface for the RF DAC has an interface rate is $f_{RF}/2^I$, with I being an integer (default I=0), and $f_{RF}$ being a radio frequency (RF) and/or a carrier frequency.

The adjusted/reduced sample rate at the ASRR 614 can depend on a TX bandwidth of the configured radio access technology (RAT). In one example, the maximum sample rate is 614.4 MHz, sample rates for smaller bandwidths are $f_{s,dig}$=614.4 MHz/$2^D$, with D being an integer.

A conversion ratio from the digital sample rate $f_{s,dig}$ to the RFDAC interface rate $f_{RF}/2^I$ is: $f_{RF}/2^I/f_{s,dig}$, which is split into an upsampling by CIC filters (at the RF processing block 608) of $2^M$, with M=floor(log 2($f_{RF}/2^I/f_{s,dig}$)), and a remaining fractional part R in [1 . . . 2] that is realized in a Lagrange Interpolator or the ASRC 606. The RFDAC interface is an interface to the RFDAC 610.

If the TX bandwidth is reduced by a factor of two (for instance comparing the NR80, NR40, NR20, NR10 and NR5 transmission), the digital or adjusted sample rate $f_{s,dig}$ at the ASRR 614 and the processing blocks 604 is reduced accordingly by a factor of two. As a result, an interpolation ratio to the RFDAC interface rate is increased by the same factor, resulting in the same Lagrange interpolator/ASRC 606 conversion ratio of R, while M is increased by 1, i.e. one additional CIC filter is applied.

Some examples of adapted sample rates at the ASRR 614 and corresponding upsampleing at the RF processing block 608 are shown below.

Example: Band 40 ($f_{RF}$=2350 MHz), NR10 transmission $f_{s,dig}$, =76.8 MHz, $f_{RF}$=2350 MHz. Thus M=floor(log 2(2350/76.8))=4 CIC stages are active, while the Lagrange Interpolator sample rate conversion ratio is R=2350/$2^4$/76.8=1.9124.

Example Band 40 ($f_{RF}$=2350 MHz), NR40 transmission $f_{s,dig}$=307.2 MHz, $f_{RF}$=2350 MHz. Thus M=floor(log 2(2350/307.2))=2 CIC stages are active, while the Lagrange Interpolator sample rate conversion ratio is R=2350/$2^2$/307.2=1.9124.

It is appreciated that other examples and/or example values are contemplated.

Some examples and sampling rates and/or clock rates for the system 500, 600 are also provided for illustrative purposes.

A digital IQ core DFE clock rate for the core DFE 504 can be fixed at 307.2 MHz. Samples, in this example, are processed in two polyphases after a half band filter, leading to a sample rate or maximum sample rate of 2×307.2 MHz=614.4 MHz. Valid samples can be indicated by an accompanying valid strobe signal. For example, if a strobe signal is active, the corresponding sample pair is valid. Thus, for the sample rate of 614.4 MHz the strobe signal is permanently high, for the sample rate of 307.2 MHz for instance, the strobe signal is active on each second clock cycle.

Physical synthesis uses the strobe signal for local clock gating, thus the power consumption decreases with the sample rate.

If the allocated resource blocks occupy a contiguous bandwidth $BW_{alloc}$ of a configured TX bandwidth $BW_{max}$, the sample rate at the ASRR 614 can be reduced by the ratio of $BW_{alloc}/BW_{max}$, without sacrificing or substantially sacrificing performance. Since the filters are typically designed for maximum bandwidth and maximum performance in one example, a reduction of the allocated BW $BW_{alloc}$ permits to also reduce the sample rate by the same amount. Stop-band suppression and in-band performance filters and sample rate converters can be the same as for TX systems without ASRR. Further, if only half of the available resource blocks are allocated, the sample rate can be reduced or additionally reduced by a factor of two as well.

Spectral centering facilitates ASRR and can be performed by a digital frequency shift (DFS) circuit.

Additionally, if a transmit power is reduced, spectral performance requirements can also be relaxed. Spectral performance is another example of performance requirements. The relaxation of spectral performance is used to loosen requirements on filters and upsamplers (also referred to as upconverters), such that a lower sample rate is possible. Replica spectra are suppressed less, as they fall into transition ranges of filters.

In one example, the ASRR 612 allows a sample rate reduction in steps of powers of two.

Sample rate reduction in can achieved by omitting valid strobes (e.g., for a sample rate reduction by a factor of 2, each second strobe is discarded, in a sample rate reduction by a factor of 4, three out of four strobes are discarded, etc.). Aliasing is not expected, as only a fraction of the available bandwidth is allocated.

In order to upsample the signal to the initial rate (without ASRR), the available CIC upsamplers are used. Reconsider the example above: an NR40 transmission in B40 uses 2 upsamplers, while an NR10 transmission uses 4. Thus, as an example, two upsamplers are activated to switch between NR40 and NR10 transmissions. These are used in NR40 transmissions with ASRR enabled, to resample to the original rate.

It is appreciated that power consumption reduction of the blocks 604 scale approximately with the sample rate reduction factor. As resource block (RB) allocations and TX power may change from slot to slot (or even from symbol to symbol for Sounding Reference Symbols (SRS)), the sample rate can be switched dynamically by the ASRR circuit 612 from slot to slot and/or from symbol to symbol.

Signal transitions can occur during sample rate changes, which can degrade signal quality. The signal processing blocks 604 can be operated at an oversampled rate (approximately five times upsampling from baseband interface in one example) and impulse responses of the effected filters are reasonably short, the transition time is relatively short in general, and the error can be accepted in terms of performance degradation. It is appreciated that other oversampling rates, such as 2, 3, and the like are contemplated.

FIG. 7 is a table 700 illustrating example signals and sampling rates in accordance with some embodiments. The signals and rates are examples that can be obtained using a DFE, such as the systems 500, 600 and suitable variations thereof. The table 700 is provided for illustrative purposes and it is appreciated that other standards and/or rate/s values are contemplated.

The table 700 is arranged in rows and columns. Each row has values for a standard as shown and various rates and stages at various points of signal processing.

A first column indicates the standard or standards for the row.

A second column indicates a sampling rate at an input to the DFE or upsampling block, such as 602.

A third column indicates the sampling rate at a portion of the DFE. In one example, it is the rate at an output of a multi-carrier DFE, such as the DFE 502.

A fourth column is a rate at after signal processing at block 604.

A fifth column is the rate used for interpolation by the ASRC 606.

A sixth column depicts the number of CIC stages.

A seventh column includes the rate used by RF processing at block 608 for an exemplarily/example selected Band.

As described above downconversion at the ASRR 614 and upconversion at RF processing 608 are generally synchronized as described above, i.e. the time offset to a reference timestamp (i.e. beginning of the slot) is equal for the downconversion and the later upconversion. In order to change the settings time (time offset) accurately, a shadow—live register circuit or circuitry that includes one or more shadow registers and one or more live registers can be employed. An example of a suitable register circuit is provided in FIG. 8.

Figure 8:
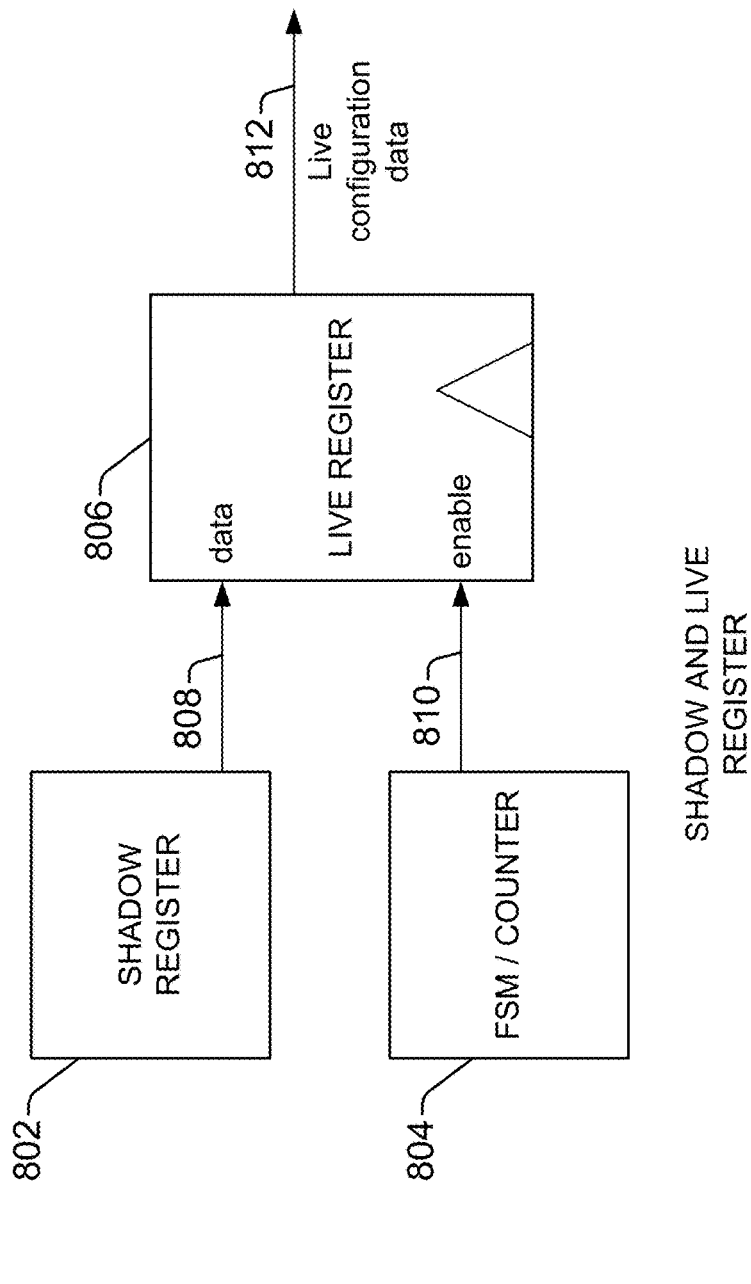
FIG. 8 is a diagram illustrating a shadow—live register circuitry in accordance with some embodiments.

FIG. 8 is a diagram illustrating a shadow—live register circuitry 800 in accordance with some embodiments. The circuitry 800 facilitates synchronization of upconversion and later downconversion in digital front end(s) and the like. The circuitry 800 is provided for illustrative purposes and it is appreciated that other circuitry can be used to facilitate synchronization of upconversion and downconversion.

The circuitry 800 can be used as the circuitry 6810 and 6812, described above with regard to the system 600.

The circuitry 800 includes a shadow register 802, a finite state machine (FSM or counter 804 and a live register 806.

The shadow register 802 buffers advance configuration values to be applied in advance, while the live register holds or carries currently active configuration values/data 812. The configuration data 808 is copied from the shadow register 802 to the live register 806 in response to a trigger event 810. The trigger (trigger event) 810 can be generated time-accurately from the FSM 810 and/or variations thereof. In one example, the trigger is generated by a hardware state machine. In another example, the trigger is generated or originated from a strobe signal controlled by firmware or a firmware control circuit.

The active configuration 812 is typically applied to downconversion or downsampler (also referred to as a downconverter) at 614 and then to upsampling (upconverter) at 608 using a trigger.

It is appreciated that different sample rates or rate settings can result in different group delays of filters. Thus, when switching the sample rate, a group delay difference is compensated. In one example, a ring buffer with adjustable length, delaying samples on the digital clock grid is employed to generate the group delay difference.

If a delay element (i.e. the ring buffer) is reconfigured in length, either some samples are skipped (delay reduction) or inserted by means of repetition (delay increase).

Filters in between the ASRR circuitry 614 and the RF processing will operate on a changing sample rate during the transition phase from one sample rate to another. A Lagrange interpolator can be considered as a FIR filter with five taps (for an interpolation order of 5). During a sample rate change, the values in the delay taps reflect samples that are non-equidistantly spaced in time. This results in a signal distortion, depending on the history each block considers (for a FIR filter this is the length of the filter).

If a change in sample rate is synchronized, a FIFO fill level and consequently the delay through the FIFO will increase or decrease. However this change can be removed by a fill level controller mechanism of the Arbitrary Sample Rate Converter (ASRC) 606. The ASRC 606 can be configured to alters the sampling rate between two asynchronous domains, which can have arbitrary sample/frequency relations to each other. After a relatively short transient time of the proportional controller, the FIFO fill level is stabilized.

Changing delays can be compensated with granularity of an integer number of digital clock cycles, for example f_clk=307.2 MHz or Tclk=3.2 ns. A residual delay is not considered and contributes to EVM. Improvement by fractional delays with AP filters is possible.

Figure 9:
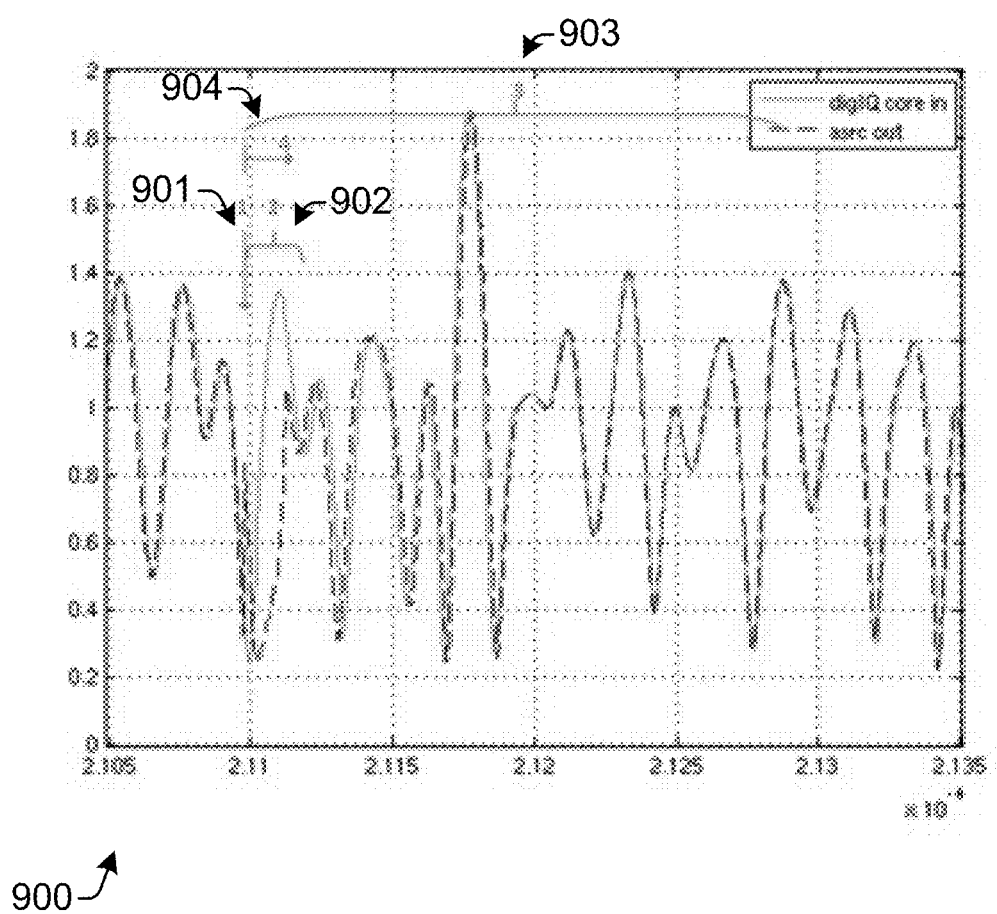
FIG. 9 is a graph illustrating example sampling rates using a TX communication system having ASRR in accordance with some embodiments.

FIG. 9 is a graph illustrating example sampling rates using a TX communication system having ASRR in accordance with some embodiments.

The graph depicts a transition of two sampling rates for a 2×20 MHz LTE transmission. A first carrier allocates 50 RBs (out of 100) and a second carrier is not allocated RBs. As a result, the sample rate can be reduced by a factor of four from 307.2 MS/s to 76.8 MS/s.

A first signal, shown as solid, is a reference SC-DFE output signal. This can be a signal received at the core DFE 504. A second signal, shown as dashed, represents the output of the digital IQ transmitter, ASRC output and/or an output of the ASRR 612.

Various distortions are shown by variations of the ASRC output when compared with the reference signal or core input signal.

A first distortion shown at 901 is a distortion due to the delay adaption. Here, the latency is reduced by cutting out samples.

A second distortion, shown at 902, is due to filter transition of the ASRC due to different sampling rates.

A third distortion is shown at 903. The FIFO fill level change (and consequently latency distortion) of the synchronization FIFO—right after the sample rate change time instant (211 us). Here a delay of the ASRC output signal with respect to the reference signal is decreased due to a lower FIFO fill level. After approximately one to two additional microseconds (213 us) the FIFO fill level is back to its desired level mitigating the error.

A fourth distortion is shown at 904. This distortion is due to a residual delay error below one clock period which remains for the rest of the transmission.

The transient mainly impacts EVM. The impact is reduced by changing the sample rate reduction on slot-boundaries only, i.e. during the time period that is not considered for EVM measurement.

Figure 10:
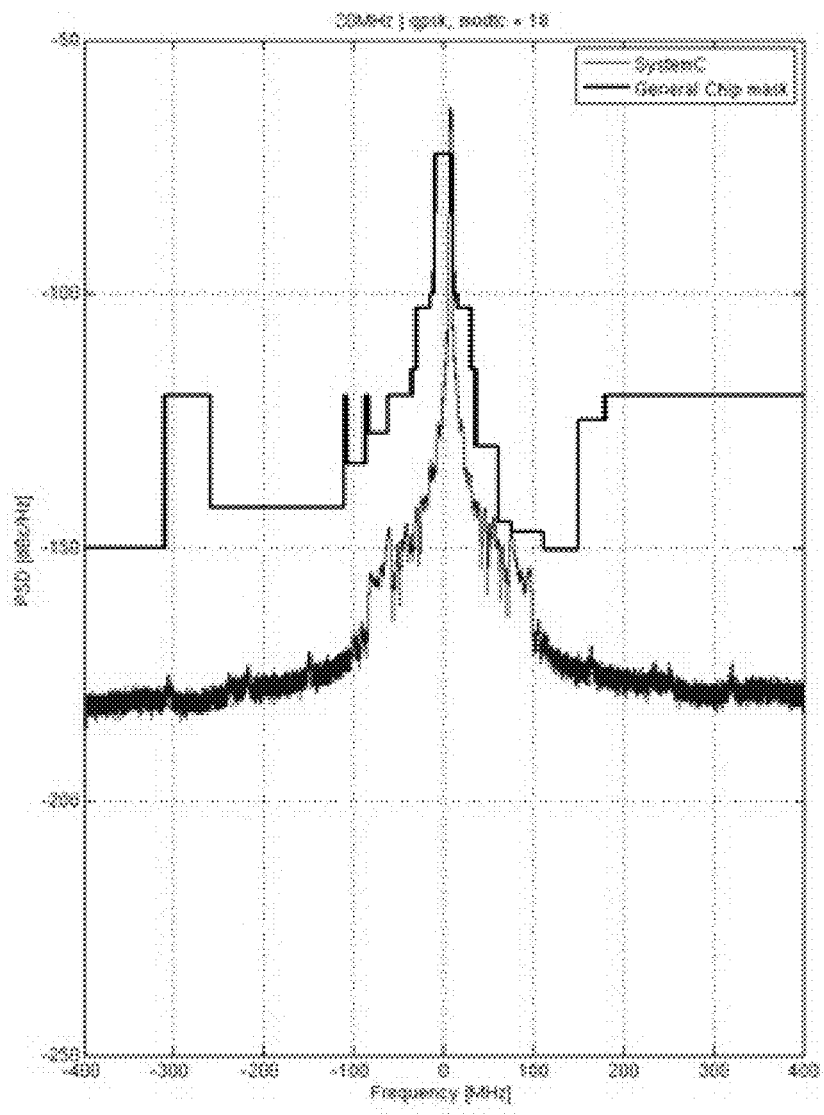
FIG. 10 is a graph indicating a first simulation of a transition between two sample rates at a time instant.
Figure 11:
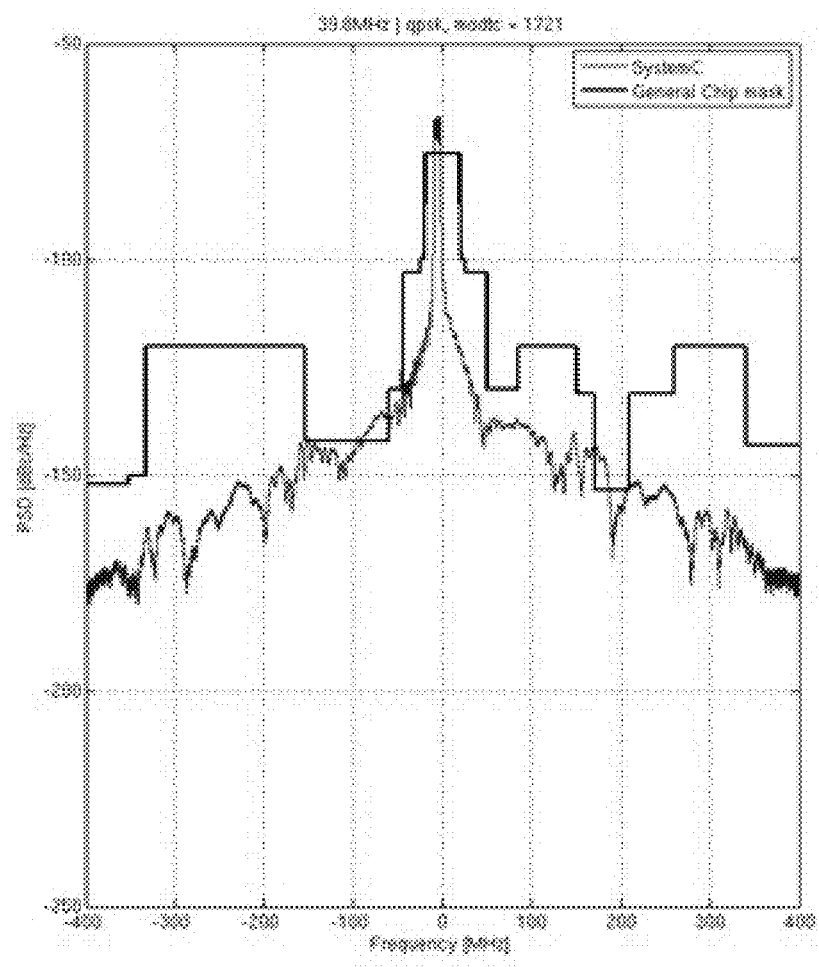
FIG. 11 is a graph indicating a second simulation of a transition between two sample rates at a time instant.

FIGS. 10 and 11 illustrate examples of degradation that can be present from transitions from one sample rate to another. The examples show error vector magnitude (EVM) degradation during transition at arbitrary time instant Two LTE slots are simulated. Transition between the two sample rates takes place at an arbitrary time instant (i.e. not on slot or symbol boundaries).

FIG. 10 is a graph 1000 indicating a first simulation of a transition between two sample rates at a time instant.

Frequency is shown along an x-axis and PSD is shown along a y-axis.

In this example, LTE20 is used and 50 RBs allocated. The ASRR generates a sample rate reduction by 2. It can be seen that the EVM RMS=0.66% and EVM peak=22%.

FIG. 11 is a graph 1100 indicating a second simulation of a transition between two sample rates at a time instant.

In this example, 2×LTE20 is used and 50 RBs are allocated. The ASRR generates a sample rate reduction by 4 As a result, the EVM RMS=1.3% and EVM peak=51%.

Figure 12:
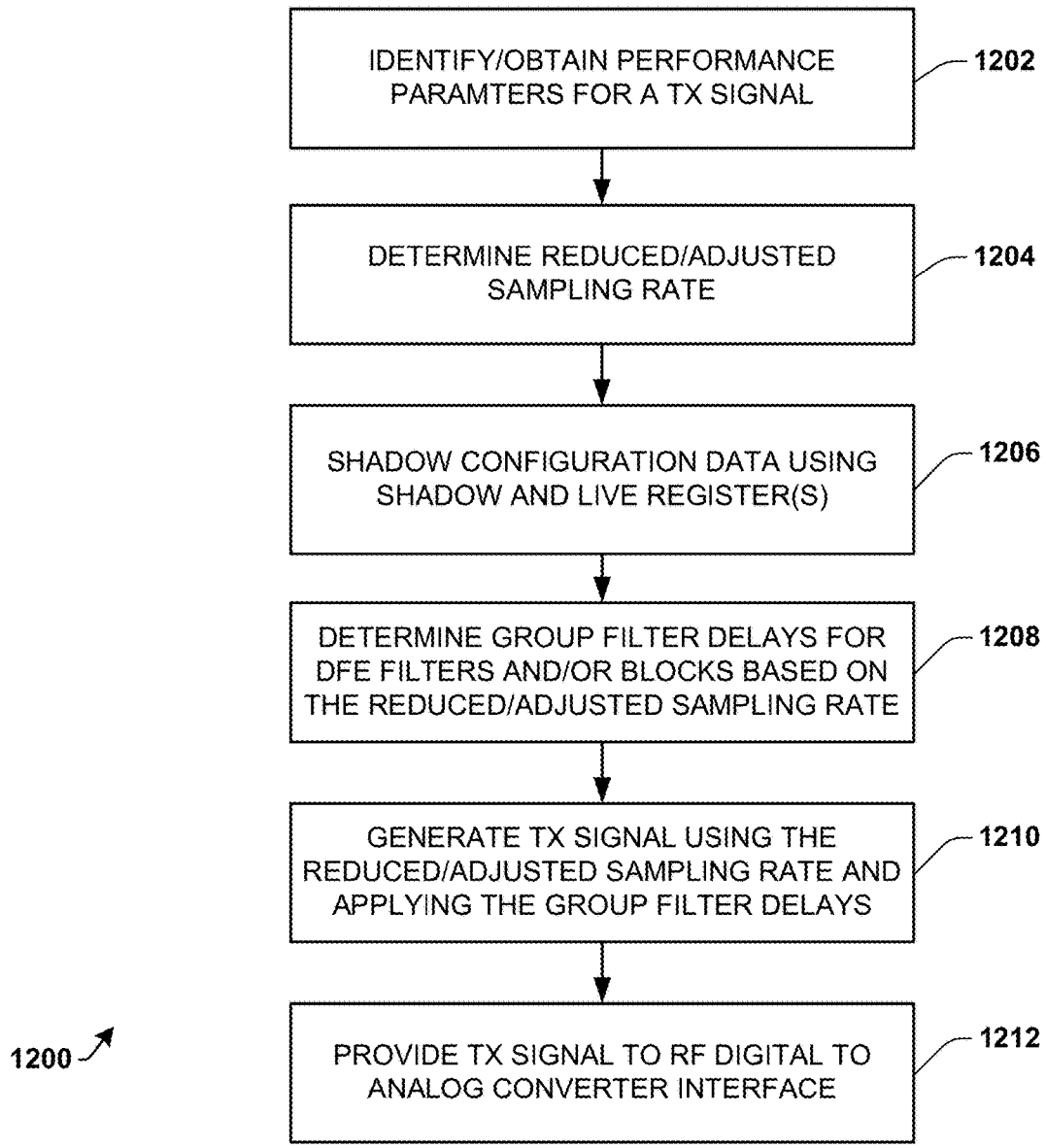
FIG. 12 is a flow diagram illustrating a method of operating a TX system having ASRR in accordance with some embodiments or aspects.

FIG. 12 is a flow diagram illustrating a method 1200 of operating a TX system having ASRR in accordance with some embodiments or aspects. The method 1200 is provided for illustrative purposes and it is appreciated that suitable variations are contemplated.

The method 1200 can be performed and is described with the above systems, such as the system 500 and the system 600. Further the method can be implemented using circuitry and/or processor, such as the front end module 115, the DFE 504, and the like.

The method 1200 begins at block 1202, where performance parameters or reduced performance parameters for a TX signal are determined, identified or obtained by control circuitry. The reduced performance parameters can include bandwidth, TX power, resource blocks and the like that are relatively low compared to designed or typical values. The performance parameters can be compared with configured or previous values to determine if there is a change. For example, the performance parameters can be reduced compared to a configured and/or previous value. In one example, configured performance parameters are configured by a network or base station for a transmission and the current performance parameters are compared with the configured performance parameters. Alternately, the performance parameters can be increased compared to a previous value.

A control circuit determines a reduced/adjusted sampling rate for use in signal processing blocks 604, at block 1204. The reduced/adjusted sampling rate is determined based on the reduced performance parameters or performance parameters from the block 1202.

The reduced/adjusted sampling rate is dynamically determined. Further, the rate can be determined at intervals based on symbol, slot, frame, burst and the like.

In one example, the reduced sampling rate is based on powers of 2.

Configuration data/settings and/or triggers is/are generated by circuitry for DFE elements, such as filters, upconverters, downconverters and the like based on the reduced sampling rate at block 1206. The configuration data/settings are also shadowed at block 1206. A shadow-live register circuit, such as the circuit 800, can be used to shadow the configuration data.

A group filter delay is determined at block 1208 by the control circuit based on the reduced/adjusted sampling rate. In one example, the group filter delay is determined for filters in the DFE and RF processing.

The configuration data/setting is applied to at least an upconverter and downconverter of the DFE, the group filter delay is applied to the filters and the TX signal is generated at block 1210 by the DFE and RF processing circuitry. The downconverter/sampler can be located at the ASRR 614 and the upconverter/upsampler can be located at the RF processing 608.

The digital TX signal is provided to an RF DAC interface for conversion to analog at block 1212.

It is appreciated that suitable variations of the method 1200 are contemplated, including incorporating additional blocks, omitting one or more blocks, and the like.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a communication system using adaptive sample rate reduction (ASRR). The system includes a digital front end (DFE) and a radio frequency (RF) circuit. The DFE is configured to receive a baseband signal, identify adjusted performance parameters for the baseband signal, dynamically adjust a sampling rate for the baseband signal based on the adjusted performance parameters, oversample and process the baseband signal and generate a digital signal using the adjusted sampling rate, wherein the adjusted performance parameters are adjusted from prior performance parameters from a prior time period. The RF circuit is configured to generate an analog TX signal from the digital interface signal.

Example 2 includes the subject matter of Example 1, including or omitting optional elements, wherein the DFE includes a control circuit configured to identify the adjusted performance parameters and determine the adjusted sampling rate.

Example 3 includes the subject matter of any of Examples 1-2, including or omitting optional elements, wherein the control circuit is configured to determine a group delay for one or more filters of the DFE based on the reduced sampling rate and apply the group delay to the one or more filters using a delay circuit.

Example 4 includes the subject matter of any of Examples 1-3, including or omitting optional elements, wherein the DFE dynamically reduces the sampling rate per symbol, slot, frame and/or burst.

Example 5 includes the subject matter of any of Examples 1-4, including or omitting optional elements, wherein the DFI is configured to generate configuration settings for the reduced sampling rate, wherein the configuration values are applied to one or more elements of the DFE to enable the adjusted sampling rate.

Example 6 includes the subject matter of any of Examples 1-5, including or omitting optional elements, wherein the DFE further comprises a shadow-live register circuit configured to synchronize the configuration settings at an upconverter and a downconverter of the DFE.

Example 7 includes the subject matter of any of Examples 1-6, including or omitting optional elements, wherein the DFE includes a multi-carrier DFE and a core DFE.

Example 8 includes the subject matter of any of Examples 1-7, including or omitting optional elements, wherein the DFE includes an arbitrary sample rate converter (ASRC) configured to synchronize a downconverter and an upconverter.

Example 9 includes the subject matter of any of Examples 1-8, including or omitting optional elements, wherein the digital signal includes a plurality of carrier based signals.

Example 10 includes the subject matter of any of Examples 1-9, including or omitting optional elements, wherein the RF circuit includes a plurality of digital to analog converters operating in parallel and configured to generate the analog TX signal from the digital signal.

Example 11 includes the subject matter of any of Examples 1-10, including or omitting optional elements, wherein the RF circuit includes a first-in-first-out (FIFO) circuit.

Example 12 includes the subject matter of any of Examples 1-11, including or omitting optional elements, wherein the adjusted performance parameters include a reduced bandwidth, wherein the reduced bandwidth is less than a configured transmission bandwidth by a fractional amount.

Example 13 includes the subject matter of any of Examples 1-12, including or omitting optional elements, wherein the adjusted performance parameters include a reduced bandwidth, wherein the reduced bandwidth is less than a configured transmission bandwidth by a fractional amount.

Example 14 includes the subject matter of any of Examples 1-13, including or omitting optional elements, wherein the adjusted performance parameters include a reduced number of resource blocks, wherein the reduced number of contiguous resource blocks is less than a previous number of resource blocks of the prior time period, wherein the timer period is a slot and/or symbol.

Example 15 is an adaptive sample rate reduction (ASRR) system comprising circuitry, a shadow register circuit and a delay circuit. The circuitry is configured to dynamically obtain adjusted performance parameters of an input signal compared with prior performance parameters, determine an adjusted sampling rate based on the adjusted performance parameters, determine digital front end (DFE) configuration settings based on the adjusted sampling rate and determine a group delay for the DFE. The shadow register circuit is configured to store and apply the DFE configuration settings. The delay circuit is configured to adjust a group delay of the DFE.

Example 16 includes the subject matter of Example 15, including or omitting optional elements, wherein the register circuit includes a shadow register coupled to a live register and a finite state machine, wherein the shadow register stores the DFE configuration settings from the circuitry, the live register stores active configuration settings for the DFE and the state machine generates a trigger to transfer the stored DFE configuration values from the shadow register to the active configuration values of the live register.

Example 17 includes the subject matter of any of Examples 15-16, including or omitting optional elements, wherein the delay circuit comprises a ring buffer having an adjustable length, wherein the adjustable length is configured by the circuitry to compensate for reduced sample rate induced delays.

Example 18 includes the subject matter of any of Examples 13-15, including or omitting optional elements, wherein the adjusted performance parameters include one or more of a reduced transmission bandwidth, a reduced transmission power, and/or a reduced number of resource blocks.

Example 19 includes the subject matter of any of Examples 13-16, including or omitting optional elements, wherein the shadow circuit is configured to generate a trigger that propagates with the input signal through signal processing circuits of the DFE for synchronization.

Example 20 is a method of operating a communication system having adaptive sample rate reduction (ASRR). The method includes obtaining one or more adjusted performance parameters for an input signal when compared with prior performance parameters; determining an adjusted sampling rate based on the one or more adjusted performance parameters; and over-sampling the input signal using the reduced sampling rate by a digital DFE to generate a digital signal.

Example 21 includes the subject matter of Example 20, including or omitting optional elements, further comprising determining a group delay for the DFE based on the adjusted sampling rate.

Example 22 includes the subject matter of any of Examples 20-21, including or omitting optional elements, further comprising converting the digital signal into an analog radio frequency (RF) transmission signal for transmission.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). The techniques can also be used with new radio (NR) 5G, also from the 3GPP organization. Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A communication system using adaptive sample rate reduction (ASRR), the system comprising:
   a digital front end (DFE) configured to receive a baseband signal, identify adjusted performance parameters for the baseband signal, dynamically adjust a sampling rate for the baseband signal based on the adjusted performance parameters, oversample and process the baseband signal and generate a digital signal using the adjusted sampling rate, wherein the adjusted performance parameters are adjusted from prior performance parameters from a prior time period; and
   a radio frequency (RF) circuit configured to generate an analog TX signal from the digital interface signal.

2. The system of claim 1, wherein the DFE includes a control circuit configured to identify the adjusted performance parameters and determine the adjusted sampling rate.

3. The system of claim 2, wherein the control circuit is configured to determine a group delay for one or more filters of the DFE based on the reduced sampling rate and apply the group delay to the one or more filters using a delay circuit.

4. The system of claim 1, wherein the DFE dynamically reduces the sampling rate per symbol, slot, frame and/or burst.

5. The system of claim 1, wherein the DFI is configured to generate configuration settings for the reduced sampling rate, wherein the configuration values are applied to one or more elements of the DFE to enable the adjusted sampling rate.

6. The system of claim 5, wherein the DFE further comprises a shadow-live register circuit configured to synchronize the configuration settings at an upconverter and a downconverter of the DFE.

7. The system of claim 1, wherein the DFE includes a multi-carrier DFE and a core DFE.

8. The system of claim 1, wherein the DFE includes an arbitrary sample rate converter (ASRC) configured to synchronize a downconverter and an upconverter.

9. The system of claim 1, wherein the digital signal includes a plurality of carrier based signals.

10. The system of claim 1, wherein the RF circuit includes a plurality of digital to analog converters operating in parallel and configured to generate the analog TX signal from the digital signal.

11. The system of claim 1, wherein the RF circuit includes a first-in-first-out (FIFO) circuit.

12. The system of claim 1, wherein the adjusted performance parameters include a reduced bandwidth, wherein the reduced bandwidth is less than a configured transmission bandwidth by a fractional amount.

13. The system of claim 1, wherein the adjusted performance parameters include an adjusted transmission power, wherein the reduced transmission power is less than a configured transmission power.

14. The system of claim 1, wherein the adjusted performance parameters include a reduced number of resource blocks, wherein the reduced number of contiguous resource blocks is less than a previous number of resource blocks of the prior time period, wherein the timer period is a slot and/or symbol.

15. An adaptive sample rate reduction (ASRR) system comprising:
   circuitry configured to dynamically obtain adjusted performance parameters of an input signal compared with prior performance parameters, determine an adjusted sampling rate based on the adjusted performance parameters, determine digital front end (DFE) configuration settings based on the adjusted sampling rate and determine a group delay for the DFE;

a shadow register circuit configured to store and apply the DFE configuration settings; and a delay circuit configured to adjust the group delay of the DFE.

16. The system of claim 15, wherein the register circuit includes a shadow register coupled to a live register and a finite state machine, wherein the shadow register stores the DFE configuration settings from the circuitry, the live register stores active configuration settings for the DFE and the state machine generates a trigger to transfer the stored DFE configuration values from the shadow register to the active configuration values of the live register.

17. The system of claim 15, wherein the delay circuit comprises a ring buffer having an adjustable length, wherein the adjustable length is configured by the circuitry to compensate for reduced sample rate induced delays.

18. The system of claim 15, wherein the adjusted performance parameters include one or more of a reduced transmission bandwidth, a reduced transmission power, and/or a reduced number of resource blocks.

19. The system of claim 15, wherein the shadow circuit is configured to generate a trigger that propagates with the input signal through signal processing circuits of the DFE for synchronization.

20. A method of operating communication system having adaptive sample rate reduction (ASRR), the method comprising:

obtaining one or more adjusted performance parameters for an input signal when compared with prior performance parameters;

determining an adjusted sampling rate based on the one or more adjusted performance parameters; and over-sampling the input signal using the reduced sampling rate by a digital DFE to generate a digital signal.

21. The method of claim 20, further comprising determining a group delay for the DFE based on the adjusted sampling rate.

22. The method of claim 20, further comprising converting the digital signal into an analog radio frequency (RF) transmission signal for transmission.

* * * * *